(12) United States Patent
Jurgilewicz et al.

(10) Patent No.: US 7,292,076 B2
(45) Date of Patent: *Nov. 6, 2007

(54) LOW VOLTAGE PULL-DOWN CIRCUIT

(75) Inventors: Robert P Jurgilewicz, Pepperell, MA (US); Victor F Fleury, North Andover, MA (US); Roger Zemke, Londonderry, NH (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/200,711

(22) Filed: Aug. 9, 2005

(65) Prior Publication Data

US 2006/0033539 A1 Feb. 16, 2006

Related U.S. Application Data

(63) Continuation of application No. 10/726,964, filed on Dec. 2, 2003, now Pat. No. 6,949,965.

(51) Int. Cl.
*H03L 7/00* (2006.01)
(52) U.S. Cl. .................... 327/143; 327/198; 327/77
(58) Field of Classification Search ............... None
See application file for complete search history.

(56) References Cited

U.S. PATENT DOCUMENTS

| | | | |
|---|---|---|---|
| 5,550,486 A | 8/1996 | Sweeney et al. | 326/14 |
| 6,198,318 B1 | 3/2001 | Bhaskaran et al. | 327/143 |
| 6,281,723 B1 | 8/2001 | Tailliet | 327/143 |
| 6,380,769 B1 | 4/2002 | Hall | 327/112 |
| 6,759,852 B1 | 7/2004 | Samad | 324/522 |
| 2003/0122595 A1 | 7/2003 | Hall et al. | 327/112 |

*Primary Examiner*—Tuan T Lam
(74) *Attorney, Agent, or Firm*—McDermott Will & Emery LLP

(57) ABSTRACT

A low voltage pull-down circuit for maintaining a node at a logic LOW voltage is provided. When a logic LOW is desired, the circuit provides a low-impedance path from the node to ground. The node may be pulled-up to a logic HIGH voltage, for example, by removing the low-impedance path and allowing a voltage source to reach the node through a resistor or transistor. A low voltage pull-down circuit may be provided in a power supervision circuit for systems that operate with, for example, low power conditions. The open-drain node is utilized as a power-on-reset node that provides a LOW logic signal to a system when the power being supplied to the system is below a predetermined voltage threshold.

20 Claims, 7 Drawing Sheets

LOW VOLTAGE PULL-DOWN CIRCUIT

Cross Reference To Related Application

This application is a continuation of application Ser. No. 10/726,964, now U.S. Pat. No. 6,949,965, filed on Dec. 2, 2003 and entitled "Low Voltage Pull-Down Circuit," which is hereby incorporated by reference herein in its entirety.

BACKGROUND OF THE INVENTION

This invention relates to power supply supervision circuits. More particularly, this invention relates to power supply supervision circuits that determine when the output of a power supply is insufficient to power a load by providing a logical LOW as an output.

A power supply supervision circuit traditionally monitors the amount of voltage that a power supply provides by comparing the supplied voltage to a pre-determined voltage threshold. If the supplied voltage is below this pre-determined voltage threshold then the power supervision circuit provides a logic LOW at an output (RESET node). In turn, the RESET node is connected to, and utilized by, the load (e.g., a system or circuit) that is being powered.

Traditional power supervision circuits require a supply voltage of at least 1 volt in order to hold the RESET node at a logic LOW. This requirement is due to a single NMOS transistor that is traditionally used to pull-down the RESET node to a logic LOW. When the supply voltage is less than the voltage threshold of the NMOS transistor, the RESET node no longer sinks current and, as a result, becomes a node with a large amount of impedance (a high-impedance node). As a result of this large impedance, erroneous leakage currents coupled to the RESET node may drive the voltage of the RESET node above the threshold that separates a logic LOW from a logic HIGH. Thus, a logic HIGH may be erroneously provided on the RESET node which, in turn, may falsely alert the load that the supply voltage is within regulation (providing a sufficient supply voltage) when the supply voltage is not within regulation (not providing a sufficient supply voltage).

Furthermore, if only a mid-scale voltage is created on a RESET node instead of, for example, a pure logic LOW (0 volts) then the load may operate in the middle of its voltage transfer characteristics. In doing so, more quiescent current may be consumed than desired. Each one of above conditions may lead to reliability problems in the load. For example, if the load is a microprocessor then the microprocessor may fail to operate properly.

As in another traditional approach, a low-valued pull-down resistor is connected between the RESET node and ground in an attempt to discharge the RESET node. A PMOS transistor is included in order to pull-up the RESET node when the power supply is sufficient to power the load. However, such a pull-up transistor occasionally does not allow a user to pull-up the RESET node to a particular voltage because the pull-up voltage is hard-wired into the circuit. Furthermore, there is a limit as to how small the external resistor may be before the resistor overcomes the pull-up strength of the PMOS transistor. Moreover, low power systems may suffer while the reset node is a logic HIGH because the resistor will continuously dissipate power. For example, if a 5 volt output is desired and a 100 KΩ pull-down resistor is used then the system must support an additional 50 μA load at the RESET node.

It is therefore desirable to provide improved power supervision circuits.

SUMMARY OF THE INVENTION

It is therefore an object of the present invention to provide improved power supervision circuits.

A power supervision circuit is provided that eliminates the floating RESET output by providing a low-impedance path from the RESET output to ground. This power supervision circuit is fabricated from a blend of multi-threshold NMOS transistors. The low impedance path pulls down the RESET output and may conduct current even when the input voltage is at 0 volts. This low-impedance path is selectively uncoupled from the RESET node in order to pull the RESET node down. Removal of the low-impedance path eliminates the leakage path that may interfere with other components (e.g., a pull-up current source). In this manner, the low impedance path is selectively coupled to the RESET node when the supply voltage is below a pre-determined level. To control the amount of current sourced from the input node to the RESET node, a configuration of PMOS transistors is provided in the power supervision circuit. Such a power supervision circuit may offer an enhanced response time for rapidly changing supply power signals due to the multi-threshold NMOS transistor configuration.

Additionally, the power supervision circuit may be configured to include multiple voltage inputs and the voltage on the RESET node (output node) may be pulled-up to any desired voltage level that represents a voltage HIGH to the load being operated.

A depletion-mode NMOS transistor with a turn-OFF threshold of, for example, less than 0 volts may also be utilized in a power supervision circuit in order to couple a low-impedance path to the RESET node at low supply voltages. A charge-pump may also be coupled to the gate of this depletion mode transistor in order to pump the gate to a negative voltage so that the low-impedance path is uncoupled from the RESET node.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION

Figure 1:
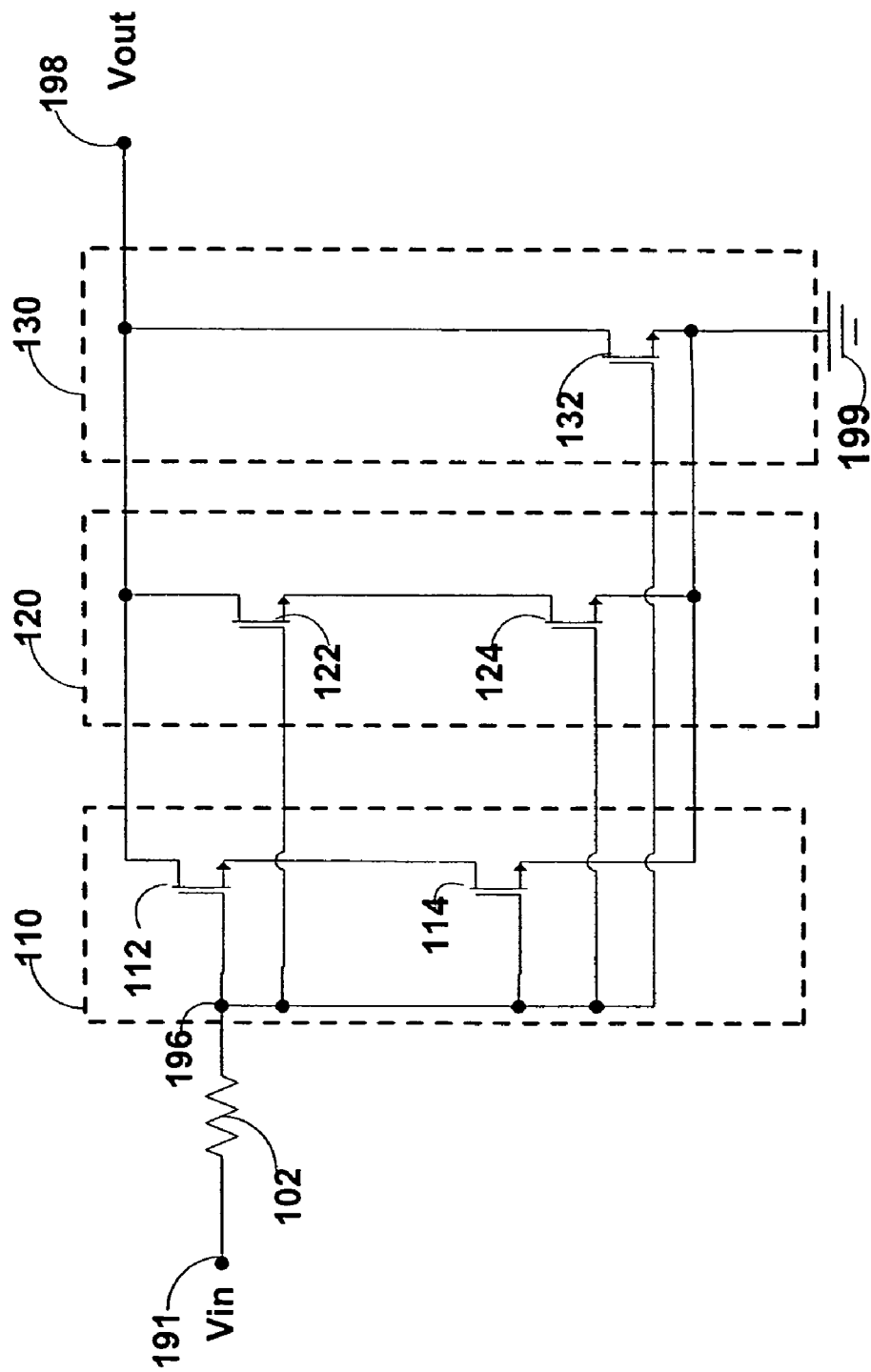
FIG. 1 is a schematic of a power supervision circuit constructed in accordance with the principles of the present invention.

Turning first to FIG. 1, power supervision circuit 100 is illustrated that includes sub-circuits 110, 120, and 130. Sub-circuits 110, 120, and 130 include NMOS transistors with different threshold voltages.

Sub-circuit 110 includes a compound configuration of depletion-mode NMOS transistors 112 and 114 such that the source terminal of NMOS transistor 112 is coupled to the drain terminal of NMOS transistor 114 and the gate terminals of NMOS transistors 112 and 114 are coupled together. Both depletion-mode NMOS transistors 112 and 114 preferably have a negative threshold voltage (e.g., −0.1 volts). This negative threshold voltage is the minimum voltage at which NMOS transistors 112 and 114 turn ON. Therefore, NMOS transistors 112 and 114 may be OFF if, for example, the voltage applied to the gate terminals of NMOS transistors 112 and 114 (with respect to the drain terminals) is −0.2 volts when the threshold voltage of the NMOS transistors is −0.1 volts. Sub-circuit 110 realizes the lowest transistor threshold voltage of sub-circuits 110, 120, and 130.

The gate terminals of NMOS transistors 112 and 114 are coupled to input node 191. Input node 191 may be coupled to a supply voltage (e.g., $V_{IN}$) so that power supervision circuit 100 provides a low-impedance path to ground on output node 198 when the supply voltage is LOW (e.g., beneath the supply voltage needed to power a particular load).

Resistor 102 is included to separate and distinguish input node 191 from intermediate node 196. Additionally, output node 198 is preferably utilized as a RESET input to a load. In this manner, output node 198 may be a RESET node to a load. Output node 198, as embodied in power supervision circuit 100, is an open-drain node and may be, for example, a node in any circuit in which a low-impedance pull-down node is desired. Persons skilled in the art will appreciate that output node 198 may be coupled to any node in a circuit. In this manner, output node 198 may be utilized to control the logic state of a node. For example, output node 198 may be coupled to an inverter instead of a RESET node to control the logic state of that inverter output.

Sub-circuit 130 includes conventional NMOS transistor 132 with a positive threshold voltage (e.g., 0.7 volts). The drain terminal of NMOS transistor 132 is coupled to output node 198 while the source terminal of NMOS transistor 132 is coupled to ground 199 (or a reference voltage). The gate terminal of NMOS transistor 132 is controlled by the voltage on input node 191. Due to a preferably large width-to-length ratio of NMOS transistor 132, sub-circuit 130 may allow for the largest current sinking capability to be provided to output node 198 when compared to sub-circuits 110 and 120. However, transistor 132 may be fabricated with other width-to-length ratios. Such a high current requirement may be necessary, for example, to handle the current in a light emitting diode (LED) coupled to output node 198 and signaling that the voltage on input node 191 is LOW. Such an LED configuration is discussed further below in conjunction with the description of system 500 of FIG. 5.

Sub-circuit 120 includes a compound configuration of NMOS transistors 122 and 124 such that the source terminal of NMOS transistor 122 is coupled to the drain terminal of transistor 124 and the gate terminals of NMOS transistors 122 and 124 are coupled together. NMOS transistors 122 and 124 preferably have a low threshold voltage (e.g., 0.3 volts). In this manner the voltage thresholds of NMOS transistors 122 and 124 are greater than the voltage thresholds of NMOS transistors 112 and 114, but are less than the voltage threshold of NMOS transistor 132.

Persons skilled in the art will appreciate that sub-circuits 110, 120, and 130 provide for a low-impedance-path to ground on output node 198 at supply voltages as low as 0 volts. The sub-circuit configuration also allows for high-current operation on node 198 in certain instances (e.g., NMOS transistor 132 is ON). The sub-circuit configuration furthermore may allow for an enhanced current capability on output node 198, while providing a low-impedance path to ground, for different supply voltages. Additional sub-circuits may be added, or sub-circuits removed, from power supervision circuit 100. For example, a power-supervision circuit with a compound NMOS configuration may be coupled between sub-circuits 120 and 130. The NMOS transistors of such a configuration may have a voltage threshold between the voltage thresholds of the NMOS transistors of sub-circuits 120 and 130 (e.g., 0.5 volts).

NMOS transistors 112 and 122 are preferably fabricated to have a device size that is significantly wider than the device sizes of NMOS transistors 114 and 124, respectively. In this manner, the ON-resistance of sub-circuits 110 and 120 may be dominated by NMOS transistors 114 and 124, respectively. For example, increasing the width of transistor 114 may decrease the ON-resistance for sub-circuit 110. Appropriately sizing NMOS transistors 114 and 124 may provide additional circuit flexibility as will be discussed further below.

At low input voltages on input node 191, for example, only sub-circuit 110 may conduct. Such low voltages are preferably between the turn-ON voltage of NMOS transistors 112 and 114 and the threshold voltage of transistors 122 and 124. Therefore, because NMOS transistors 112 and 114 are depletion-mode transistors, such low voltages may be between between 0 volts and the voltage threshold of transistors 112 and 114 (e.g., 0 volts<$V_{IN}$<0.3 volts). In such instances, a low-impedance path is established from output node 198 to ground 199. This low-impedance path effectively holds the voltage on output node 198 LOW, even when modest external pull-up currents are coupled to node 198.

For input voltages on input node 191 between the threshold voltages of the NMOS transistors of sub-circuit 120 (e.g., 0.3 volts) and NMOS transistor 132 (e.g., 0.7 volts), both sub-circuits 110 and 120 are conducting. In such instances, NMOS transistors 112, 114, 122, and 124 are ON.

For input voltages on input node 191 above the voltage threshold of NMOS transistor 132 (e.g., 0.7 volts), all sub-circuits 110, 120, and 130 are conducting. In such instances, NMOS transistors 112, 114, 122, 124, and 132 are ON.

However, the voltage on node 198 is preferably HIGH when the input voltage on input node 191 is in a pre-determined voltage range (e.g., above a particular threshold voltage). One method to pull-up node 198 is controlled by a logical $V_{UP}$ voltage that is introduced to the power supervision circuit to signal when the power supply is sufficient to operate a particular load. Such a logical $V_{UP}$ voltage is included in power supervision circuit 200 of FIG.

2, in which components 2XX are preferably the same as components 1XX of FIG. 1 for the same "XX" reference numerals.

More particularly, output node 298 is released from a logic LOW state and pulled-up to a logic HIGH state by turning NMOS transistor 242 ON via a logical $V_{UP}$ voltage on control node 297. By turning NMOS transistor 242 ON, the voltage on intermediate node 296 is pulled to ground. With the voltage on intermediate node 296 at a near-ground voltage or ground, sub-circuits 220 and 230 preferably turn OFF. However, sub-circuit 210 remains ON due to the negative threshold of the depletion mode transistor. However, sub-circuit 220 may still be ON depending on process variations and the operating temperature of power supervision circuit 200.

The logical $V_{UP}$ voltage on control node 297 may be provided in a variety of ways. For example, the logical $V_{UP}$ voltage may be the output of a comparator circuit that compares the input voltage (e.g., the voltage on input node 291) with the minimum voltage required by a particular load.

Figure 2:
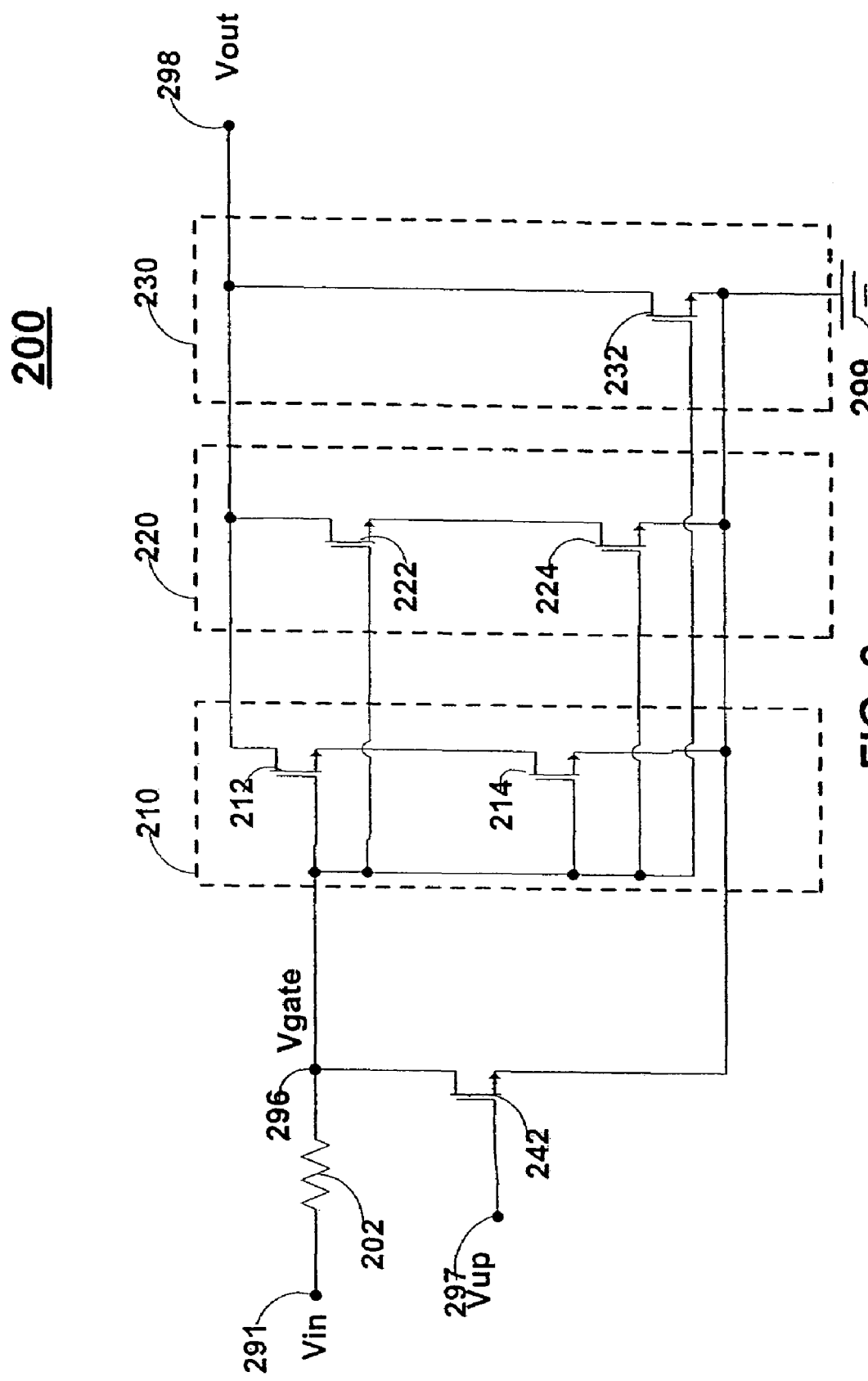
FIG. 2 is another schematic of a power supervision circuit constructed in accordance with the principles of the present invention.
Figure 3:
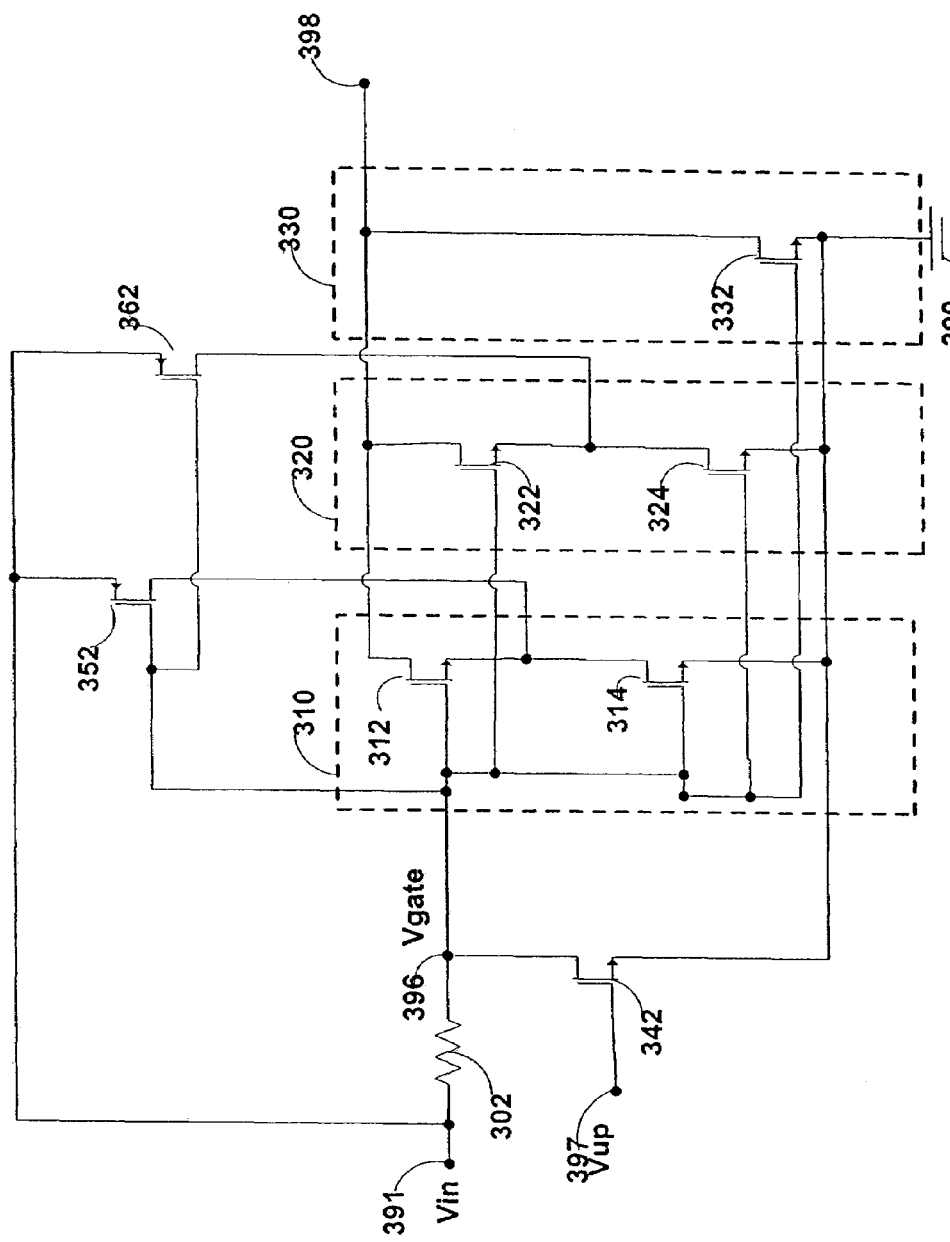
FIG. 3 is yet another schematic of a power supervision circuit constructed in accordance with the principles of the present invention.

To safely shut sub-circuits 210 and 220 OFF, such that the voltage on node 298 may be pulled-up to a logic high, additionally circuitry may be included in the power supervisor circuit. As shown in power supervision circuit 300 of FIG. 3, PMOS switches 352 and 362 are included to control, in certain instances, the state of sub-circuits 210 and 220. Here, components 3XX are preferably the same as components 2XX of FIG. 2 for the same "XX" reference numerals.

PMOS switches 352 and 362 are turned ON when the voltage on intermediate node 396 is, for example, pulled-down to ground. Therefore, PMOS switches 352 and 362 are ON when NMOS transistor 342 is ON which is, in turn, determined by the logical $V_{UP}$ voltage on control node 397.

The source terminals of PMOS switches 352 and 362 are coupled to input node 391. The drain terminals of PMOS switches 352 and 362 are coupled to the source terminals of NMOS transistors 312 and 322, respectively. The source terminals of NMOS transistors 312 and 322 are also the drain terminals for NMOS transistors 314 and 324, respectively. Thus, when PMOS switches 352 and 362 are ON, NMOS transistors 312 and 322 are OFF. NMOS transistors 312 and 322 are OFF because the voltage at the source terminals of transistors 312 and 322 are HIGH (e.g., the voltage on node 391) while the gate terminals of transistors 312 and 322 are approximately equal to ground. Therefore, the gate-source voltage on NMOS transistors 312 and 322 is a large negative voltage that overcomes the depletion threshold (e.g., −0.1 volts) of NMOS transistor 312 and the intermediate threshold of NMOS transistor 322. In this manner, all of sub-circuits 310, 320, and 330 turn OFF and all low-impedance paths to ground are removed. Because output node 398 no longer has a low-impedance path to ground, the voltage on output node 398 may be pulled-up to a logical HIGH. Current in NMOS transistors 314 and/or 324 is then preferably sourced from node 391.

Output node 398 may be pulled-up to a logical HIGH in a variety of ways. For example, customizing output node 398 may include coupling a voltage source to output node 398 via a resistor. In this manner, the value of the voltage source may determine the voltage level that node 398 is pulled-up to when the low-impedance path is removed. When the low-impedance path is switched ON (e.g., any one of sub-circuits 110, 120, and 130 are ON), the power provided by the voltage source may, in turn, be dropped across the resistor.

The amount of depletion mode transistor strength (e.g., the width of NMOS transistor 314) in a power supervision circuit of the present invention may be increased in order to decrease the low voltage ON-resistance of that circuit. Yet, low power systems occasionally require low quiescent current. Therefore, the amount of depletion mode transistor strength is preferably consistent with the needs of such low quiescent current circuits. The current sourcing from the voltage input on input node 391 to NMOS transistors 314 when the pull-down function is OFF (no low-impedance path exists to output node 398), increases by increasing the width of NMOS transistor 314.

Customers of power supervision circuits generally define a maximum current that can be tolerated from the voltage input on input node 391. Therefore, adjusting the amount of width of NMOS transistor 314 is one method to adjust circuit 300 to meet such customer requirements.

Moreover, maximum depletion-mode device strength may be limited as follows. Although the pull-down strength provided by the low threshold devices (e.g., sub-circuit 320) is effective at LOW input voltages, the device strength is generally insufficient to meet customer requirements over the entire pull-down profile (e.g., $0<V_{IN}<$voltage sufficient to power the load). Additional pull-down strength may be obtained with a blend of multi-threshold devices, as introduced earlier in connection with circuit 100 of FIG. 1.

External devices may be coupled to node 398. For example, multiple circuits 300 may be coupled to node 398 wherein each circuit is configured to supervise a voltage having at least a particular threshold. In this manner, suppose that an external device forces output node 398 LOW, even though circuit 300 is attempting to indicate an above-threshold condition. As a result, additional current may be sourced from input node 391 to output node 398 via NMOS transistors 312 and 322. In turn, the external pull-down source may be pulled-up such that the current through transistor 312 is M times larger than the current in transistor 314, where M is the ratio of aspect ratios of NMOS transistors 312 and 314 as follows:

$$M=(WIDTH_{312}*LENGTH_{314})/(WIDTH_{314}*L_{312})$$

In this manner, the total current from input node 391 is M+1 times the current in NMOS transistor 314 ($I_{391}=(M+1)I_{314}$). To reduce the amount of current sourced to output node 398 during an external pull-down event, current mirrors may be added to circuit 300 of FIG. 3. Persons skilled in the art will appreciate that the above equations also hold true for NMOS transistors 322 and 324.

Figure 4:
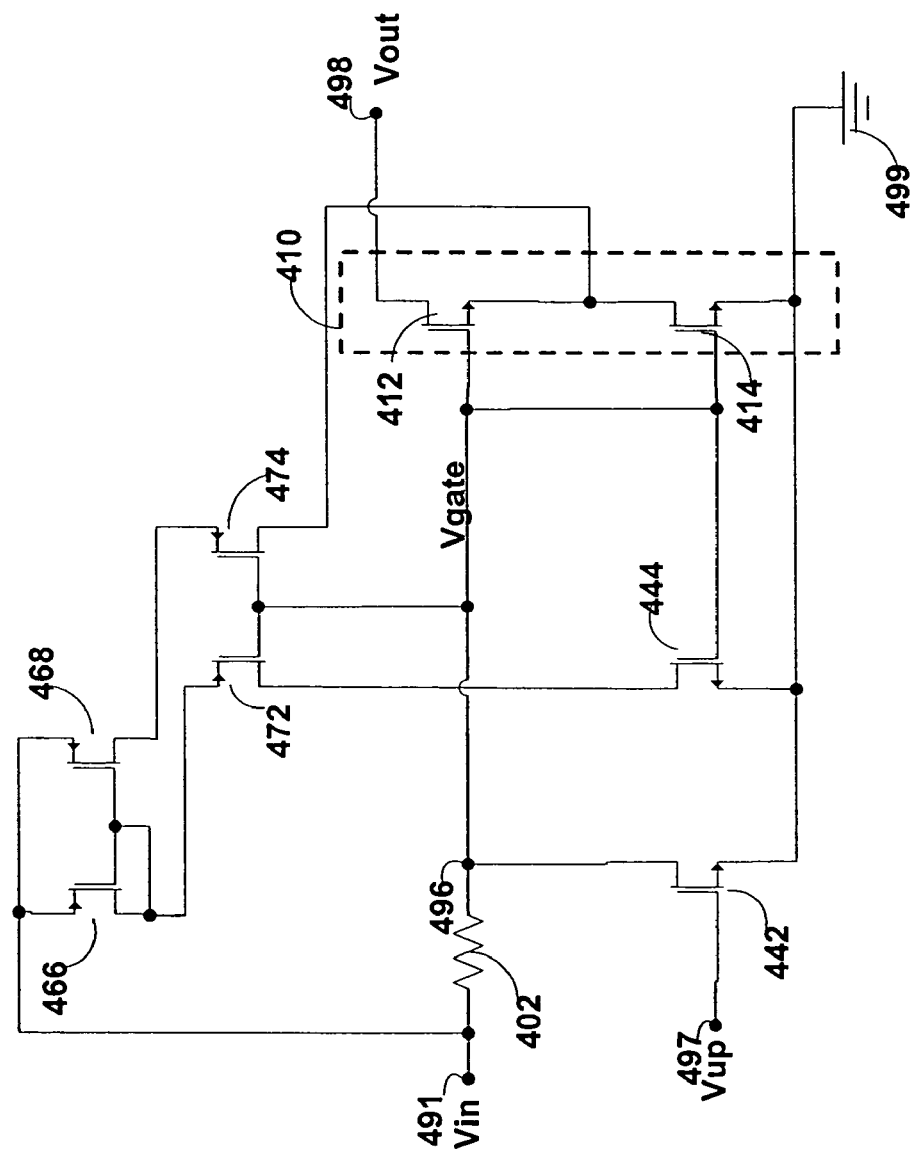
FIG. 4 is another schematic of a power supervision circuit constructed in accordance with the principles of the present invention.

Supervisor circuit 400 of FIG. 4 includes a current mirror configuration to reduce the amount of current sourced to output node 498 during, for example, an external pull-down event. Here, components 4XX are preferably the same as components 3XX of FIG. 3 for the same "XX" reference numerals. For clarity, only sub-circuit 410 has been included in circuit 400. Thus, current mirrors, like those included in circuit 400 for sub-circuit 410 may also be used for the additional sub-circuits (e.g., sub-circuits 320 and 330 of FIG. 3).

More particularly, NMOS transistor 444 is included in circuit 400 and preferably is fabricated with the same characteristics as NMOS transistor 414. NMOS transistor 444 samples a fraction (1/N) of the current in NMOS transistor 414 when the voltage at intermediate node 496 is LOW. PMOS transistor 472 is included to pass the current in NMOS transistor 444 to PMOS transistor 466 for mirroring the current to PMOS transistor 468 by a gain G.

Preferably, the ratio GIN is set greater than 1 in order to overcome any current mirror mismatching characteristics. Persons skilled in the art will appreciate that the transistors of the present invention may have substrate terminals coupled to a source voltage, ground, or a node. For example, PMOS transistor 466 may have a substrate terminal coupled to a source voltage (not shown).

The current source formed by PMOS transistor 468 limits the maximum amount of current that may be sourced from input node 491 when external pull-down is applied to output node 498. More particularly, the current that may be sourced is limited to following formula:

$$I_{468}=(G/N)I_{414}$$

Thus, an appropriate GIN should be employed. One method to change N may include, for example, changing the sizing characteristics of PMOS transistor 444 and 414.

As a result of the improvements provided in power supervision circuit 400, the percentage reduction in quiescent current sourced from input node 491 is as follows:

$$I_{468}/I_{491} = [(G/N)I_{414}]/[(M+1)I_{414}]*100\%$$
$$= [(G/N)/(M+1)]*100\%$$

Using, for example, design values where G/N is 1.5 and M is 2, the quiescent current savings is therefore equal to 50%. However, as shown below, the percentage reduction in current sourced to output node 498 during an external pull-down event is the same.

$$I_{412(new)}/I_{412(old)} = [(G/N)(M/(M+1))I_{414}]/[(M)I_{414}]*100\%$$
$$= [(G/N)/(M+1)]*100\%$$

Figure 5:
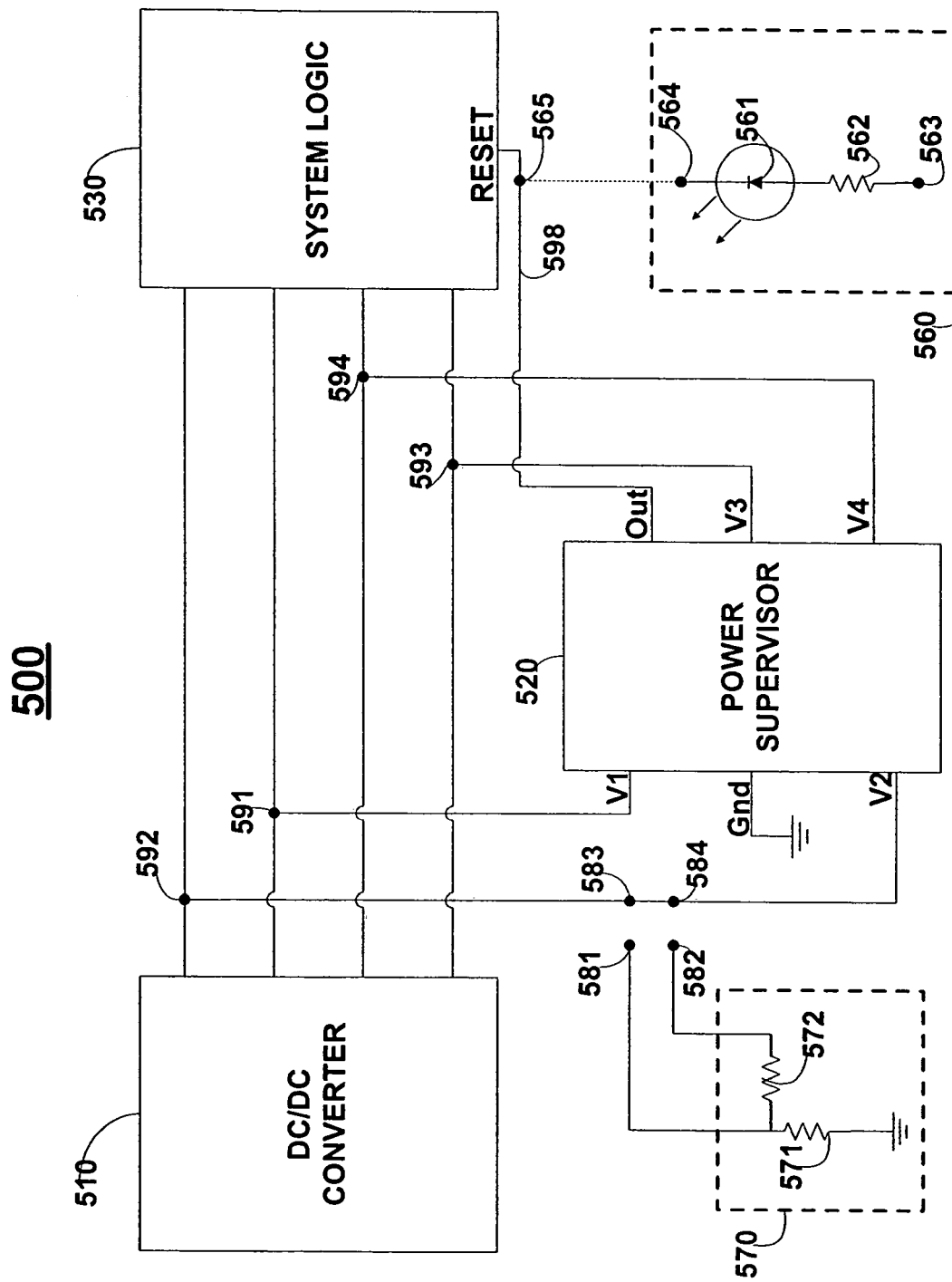
FIG. 5 is a system topology of a power supervision circuit, configured to supervise multiple power supply voltages, that is coupled to a load.

Turning now to system 500 of FIG. 5, power supervisor 520 is shown for supervising four voltage inputs 591-594 to system logic 530. As included, the four voltage inputs are provided by DC/DC converter 510. However, such voltage inputs may be supplied by any type of voltage supply. For each one of voltage inputs 591-594, a power supervision circuit (e.g., power supervision circuit 300 of FIG. 3) is provided. The output nodes (e.g., output node 398 of FIG. 3) of these four power supervision circuits (not shown) are coupled together at node 598 to provide a single output for power supervisor 520.

In this manner, if any of the voltage inputs are below the voltage threshold of the respective power supervision circuit then the voltage on node 598 is preferably pulled-down to a logic LOW. However, power supervisor may have multiple outputs. Each of these logic outputs may be the output node of each power supervision circuit included in power supervisor 520. In this manner, multiple outputs may be controlled by power supervisor 520.

In order to change the input voltage of the power supervision circuits of power supervisor 520, resistor configuration 570 may be coupled to a power supervisor input. For example, to adjust the voltage supplied by node 592 to power supervisor 502, the connection between nodes 583 and 584 may be removed and node 581 may be coupled to node 583 while node 582 may be coupled to node 584. In this manner the value of resistors 571 and 572 determines the amount of voltage supplied to power supervisor 520 via node 592.

The logical $V_{UP}$ signal (not shown) for each of the power supervision circuits (not shown) of power supervisor 520 may also be the same node. For example, if only one output node 598 is included on power supervisor 520 then only one logical $V_{UP}$ signal may be needed. Such a logical $V_{UP}$ signal may be the result of a configuration of comparators, and additional circuitry, that determines if each one of voltage inputs 591-594 is of at least a minimum voltage. Such minimum voltages may be, and occasionally are, different for each one of the power supervision circuits.

LED 561 may also be coupled to output node 598 by, for example, coupling node 564 to node 565. A supply voltage may be placed on node 563. A resistor providing current limiting may be included between LED 561 and node 563. LED 561 preferably turns on only when the voltage on output node 598 is LOW. Alternatively, LED 561 may be configured to turn ON when the voltage on output node 598 is HIGH.

Figure 6:
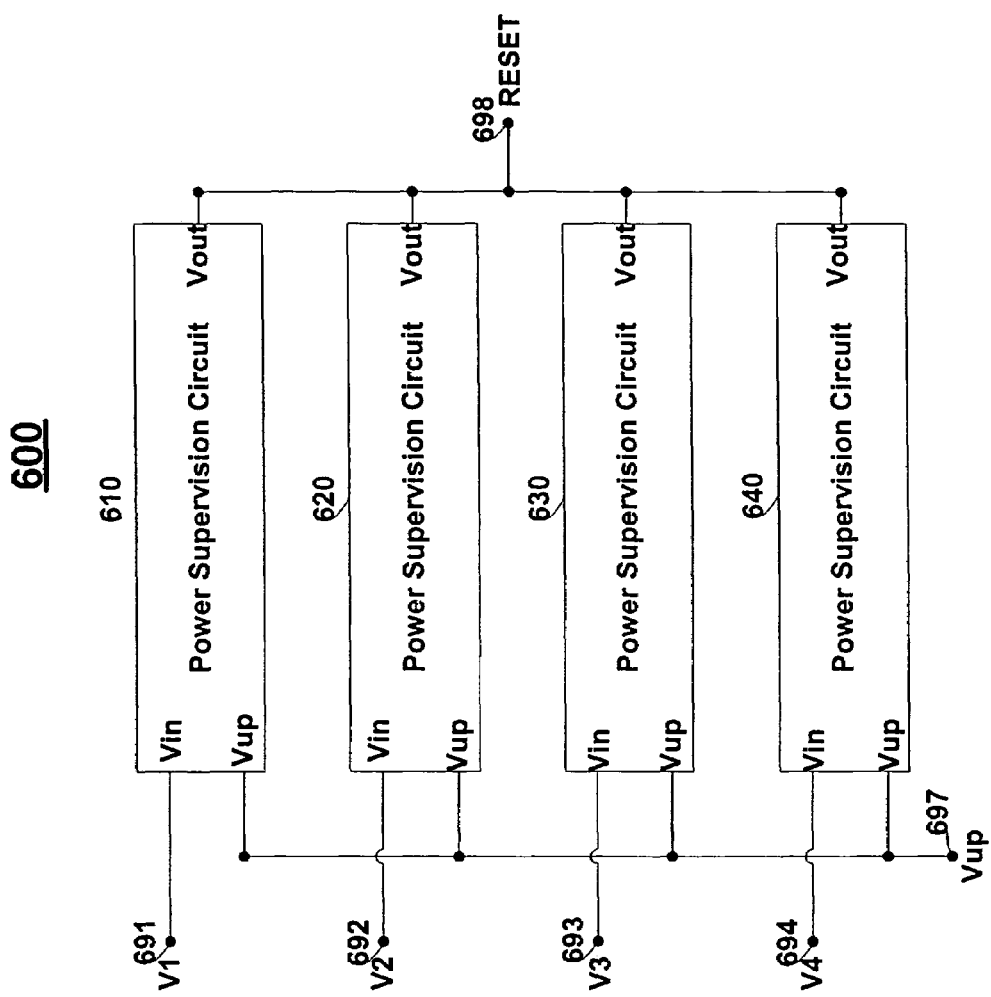
FIG. 6 is a top-level schematic of a power supervisor circuit with multiple power supervision circuits constructed in accordance with the principles of the present invention.

Turning to FIG. 6, power supervisor 600 is provided. Power supervisor 600 includes power supervision circuits 610, 620, 630, and 640 with common output node 698 and common logical $V_{UP}$ signal node 697. Each of power supervision circuits 610, 620, 630, and 640 receives separate voltage inputs 691, 692, 693, and 694, respectively.

Figure 7:
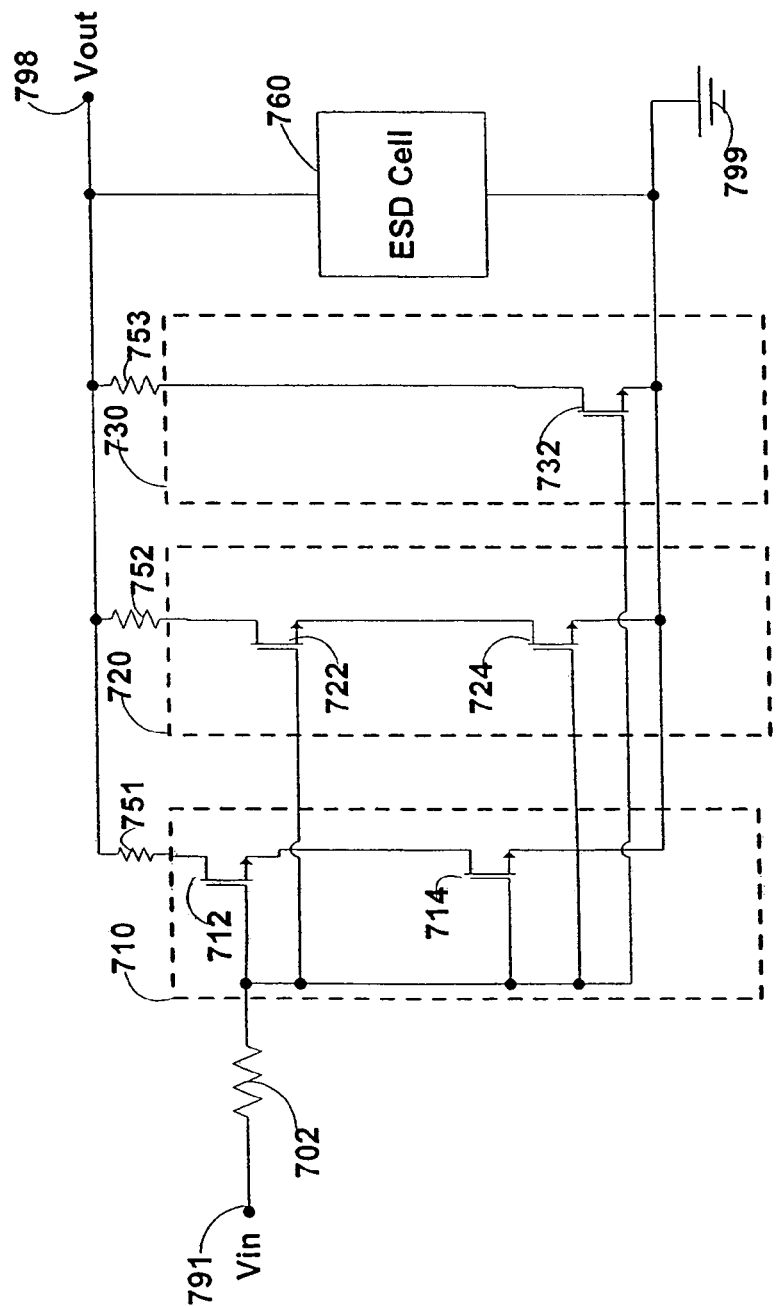
FIG. 7 is a schematic of a power supervision circuit having an electrostatic discharge protection scheme constructed in accordance with the principles of the present invention.

FIG. 7 shows power supervision circuit 700 with an electrostatic discharge protection scheme. Here, components 7XX are preferably the same as components 1XX of FIG. 1 for the same "XX" reference numerals. The electrostatic discharge (ESD) performance at output node 798 may vary depending on to the sizing and layout configurations of the transistors in sub-circuits 710, 720, and 730. In order to increase the performance of the ESD capabilities at output node 798, at least one ESD cell 760 is included in power supervision circuit 700. Resistors 751, 752, and 753 may also be included.

ESD cell 760 is preferably a n+pn+ device. All devices in power supervision circuit 700 are vulnerable to ESD damage. NMOS transistors 712 and 714, however, may be the most vulnerable if included as depletion mode transistors. During an ESD event, NMOS transistor 732 is the first to turn ON. Because NMOS transistor 732 is preferably current limited, ESD cell 760 absorbs the majority of the ESD current. Thus, ESD cell 760 relieves NMOS transistor 732 (and the rest of the transistors of power supervision circuit 700) from electrical stress. Resistors 751-753 are preferably fabricated from polysilicon and provide current limiting. Resistors 751 and 752 are also preferably included with larger resistances than resistor 753. Thus, sub-circuits 710 and 720 are less likely to conduct any current during an ESD event. Multiple ESD cells 760 may be included in power supervision circuit 700.

From the foregoing description, persons skilled in the art will recognize that this invention provides systems and methods of maintaining a valid output level at LOW power supply voltages. In addition, persons skilled in the art will appreciate that the various configurations described herein may be combined, or combined with other circuitry, without departing from the present invention. For example, the power supervision circuits of power supervisor 520 of FIG. 5 may differ. It will also be recognized that the invention may take many forms other than those disclosed in this specification. For example, the present invention may be used to systems requiring guaranteed operation under power-up conditions such as, for example, voltage regulators, voltage converters, and pass elements of low drop-out (LDO) architectures. Additionally, the NMOS transistors of the present invention may be replaced by PMOS transistors (and vice versa) and be employed in a pull-up circuit. Accordingly, it is emphasized that the invention is not limited to the disclosed methods, systems and apparatuses, but is intended to include variations to and modifications thereof which are within the spirit of the following claims.

What is claimed is:

1. A circuit for pulling-down an output node comprising:
    an input node;
    a ground terminal;
    a first sub-circuit coupled to said input node, said ground terminal, and said output node, said first sub-circuit comprising:
        a first NMOS transistor having a first voltage threshold; and
        a second NMOS transistor in a compound configuration with said first NMOS transistor, wherein said second NMOS transistor has a second voltage threshold substantially equal to said first voltage threshold and said first sub-circuit provides a first current path from said ground terminal to said output node when said first and second NMOS transistors are ON;
    a second sub-circuit coupled to said input node, said ground terminal, and said output node, said second sub-circuit comprising:
        a third NMOS transistor having a third threshold voltage that is greater than said first and second voltage thresholds, wherein said second sub-circuit provides a second current path from said ground terminal to said output node when said third NMOS transistor is ON; and
        a fourth NMOS transistor, coupled to said third NMOS transistor in a compound configuration, having a fourth threshold voltage that is substantially similar to said third threshold voltage.

2. The circuit of claim 1 wherein said first and second voltage thresholds are less than 0 volts.

3. The circuit of claim 1 wherein said first and second voltage thresholds are greater than 0 volts and less than 0.3 volts.

4. The circuit of claim 1 wherein the source terminal of said first NMOS transistor is coupled to the drain terminal of said second NMOS transistor, the gate terminal of said first NMOS transistor is coupled to the gate terminal of said second NMOS transistor, the drain terminal of said first NMOS transistor is coupled to said output node, the source terminal of said second NMOS transistor is coupled to said ground terminal, and the gate terminals of said first and second NMOS transistors are coupled to said input node.

5. The circuit of claim 4 wherein the gate terminals of said first and second NMOS transistors are coupled to said input node via a resistor.

6. The circuit of claim 1 wherein the drain terminal of said third NMOS transistor is coupled to said output node, the source terminal of said third NMOS transistor is coupled to said ground terminal, and the gate terminal of said third NMOS transistor is coupled to said input node.

7. The circuit of claim 1 wherein the third threshold voltage is approximately 0.3 volts.

8. The circuit of claim 1 further comprising a current mirror coupled to said first sub-circuit for controlling the amount of current at said output node.

9. The circuit of claim 1 further comprising a transistor coupled to said first sub-circuit, wherein said output node is pulled-up when a voltage HIGH is applied to the gate terminal of said transistor.

10. A circuit for pulling-down an output node comprising:
    an input node;
    a ground terminal;
    a first sub-circuit coupled to said input node, said ground terminal, and said output node, said first sub-circuit comprising:
        a first depletion-mode NMOS transistor having a first voltage threshold; and
        a second depletion-mode NMOS transistor in a compound configuration with said first NMOS transistor, wherein said second NMOS transistor has a second voltage threshold substantially equal to said first voltage threshold, said first sub-circuit provides a first current path from said ground terminal to said output node when said first and second NMOS transistors are ON, and said first and second voltage thresholds are less than 0 volts; and
    a second sub-circuit coupled to said input node, said ground terminal, and said output node, said second sub-circuit comprising:
        a third NMOS transistor having a third threshold voltage that is greater than said first and second voltage thresholds, wherein said second sub-circuit provides a second current path from said ground terminal to said output node when said third NMOS transistor is ON.

11. The circuit of claim 10, wherein said first and second voltage thresholds are approximately −0.1 volts.

12. The circuit of claim 10, wherein said third voltage threshold is approximately 0.3 volts.

13. The circuit of claim 10, wherein said first and second voltage thresholds are approximately −0.1 volts and said third voltage threshold is approximately 0.3 volts.

14. The circuit of claim 10, wherein said first and second voltage thresholds are approximately −0.1 volts and said third voltage threshold is approximately 0.7 volts.

15. The circuit of claim 10, wherein said third voltage threshold is approximately 0.7 volts.

16. The circuit of claim 10 wherein the source terminal of said first NMOS transistor is coupled to the drain terminal of said second NMOS transistor, the gate terminal of said first NMOS transistor is coupled to the gate terminal of said second NMOS transistor, the drain terminal of said first NMOS transistor is coupled to said output node, the source terminal of said second NMOS transistor is coupled to said ground terminal, and the gate terminals of said first and second NMOS transistors are coupled to said input node.

17. The circuit of claim 16 wherein the gate terminals of said first and second NMOS transistors are coupled to said input node via a resistor.

18. The circuit of claim 10 wherein the drain terminal of said third NMOS transistor is coupled to said output node, the source terminal of said third NMOS transistor is coupled to said ground terminal, and the gate terminal of said third NMOS transistor is coupled to said input node.

19. The circuit of claim 10 further comprising a current mirror coupled to said first sub-circuit for controlling the amount of current at said output node.

20. The circuit of claim 10 further comprising a transistor coupled to said first sub-circuit, wherein said output node is pulled-up when a voltage HIGH is applied to the gate terminal of said transistor.

* * * * *